(12) United States Patent
Burns et al.

(10) Patent No.: US 10,957,583 B2
(45) Date of Patent: Mar. 23, 2021

(54) SELF-ALIGNED QUADRUPLE PATTERNING (SAQP) FOR ROUTING LAYOUTS INCLUDING MULTI-TRACK JOGS

(71) Applicant: International Business Machines Corporation, Armonk, NY (US)

(72) Inventors: Sean D. Burns, Hopewell Junction, NY (US); Lawrence A. Clevenger, Saratoga Springs, NY (US); Matthew E. Colburn, Schenectady, NY (US); Sivananda K. Kanakasabapathy, Pleasanton, CA (US); Yann A. M. Mignot, Slingerlands, NY (US); Christopher J. Penny, Saratoga Springs, NY (US); Roger A. Quon, Rhinebeck, NY (US); Nicole A. Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/553,342

(22) Filed: Aug. 28, 2019

(65) Prior Publication Data
US 2019/0393082 A1  Dec. 26, 2019

Related U.S. Application Data

(62) Division of application No. 15/949,325, filed on Apr. 10, 2018, now Pat. No. 10,546,674, which is a
(Continued)

(51) Int. Cl.
*H01L 21/768* (2006.01)
*H01L 21/02* (2006.01)
(Continued)

(52) U.S. Cl.
CPC .... *H01L 21/76816* (2013.01); *H01L 21/0217* (2013.01); *H01L 21/02164* (2013.01);
(Continued)

(58) Field of Classification Search
CPC ......... H01L 21/76816; H01L 21/02164; H01L 21/0217; H01L 21/0337; H01L 21/31116;
(Continued)

(56) References Cited

U.S. PATENT DOCUMENTS

| 6,682,999 B1 | 1/2004 | Mucha |
| 7,517,637 B2 | 4/2009 | Colburn |

(Continued)

FOREIGN PATENT DOCUMENTS

| KR | 100817089 B1 | 3/2008 |
| KR | 1020080081653 A | 9/2008 |
| WO | 2015047321 A1 | 4/2015 |

OTHER PUBLICATIONS

List of IBM Patents or Patent Applications Treated as Related; (Appendix P), Date Filed Aug. 28, 2019; 2 pages.

*Primary Examiner* — David A Zarneke
(74) *Attorney, Agent, or Firm* — Cantor Colburn LLP; James Nock

(57) ABSTRACT

An interconnect structure having a pitch of less than 40 nanometers and a self-aligned quadruple patterning process for forming the interconnect structure includes three types of lines: a β line defined by a patterned bottom mandrel formed in the self-aligned quadruple patterning process; a γ line defined by location underneath a top mandrel formed in the self-aligned quadruple patterning process; and an α line defined by elimination located underneath neither the top mandrel or the bottom mandrel formed in the self-aligned quadruple patterning process. The interconnect structure further includes multi-track jogs selected from a group
(Continued)

consisting of a βγβ jog; a βαβ jog; an αβγ jog; a γβα jog, and combinations thereof. The first and third positions refer to the uncut line and the second position refers to the cut line in the self-aligned quadruple patterning process.

19 Claims, 10 Drawing Sheets

Related U.S. Application Data division of application No. 15/172,265, filed on Jun. 3, 2016, now Pat. No. 9,991,156.

(51) Int. Cl.
  *H01L 21/311* (2006.01)
  *H01L 23/528* (2006.01)
  *H01L 23/522* (2006.01)
  *H01L 23/532* (2006.01)
  *H01L 21/033* (2006.01)
  *H01L 21/027* (2006.01)

(52) U.S. Cl.
  CPC .... *H01L 21/0337* (2013.01); *H01L 21/31116* (2013.01); *H01L 23/528* (2013.01); *H01L 23/5226* (2013.01); *H01L 23/53266* (2013.01); *H01L 21/027* (2013.01); *H01L 21/02697* (2013.01); *H01L 21/0338* (2013.01); *H01L 21/76885* (2013.01); *H01L 21/76886* (2013.01); *H01L 21/76892* (2013.01)

(58) Field of Classification Search
  CPC ............... H01L 21/5226; H01L 21/528; H01L 21/53266
  See application file for complete search history.

(56) References Cited

U.S. PATENT DOCUMENTS

| | | |
|---|---|---|
| 8,415,089 B1 | 4/2013 | Gupta et al. |
| 8,461,678 B2 | 6/2013 | Edelstein |
| 8,719,757 B2 | 5/2014 | Yuan et al. |
| 8,751,974 B2 | 6/2014 | Kahng |
| 8,802,574 B2 | 8/2014 | Yuan et al. |
| 8,881,083 B1 | 11/2014 | Deng |
| 8,907,497 B2 | 12/2014 | Chang et al. |
| 8,962,432 B2 | 2/2015 | Lee et al. |
| 9,122,169 B2 | 9/2015 | Hu |
| 9,209,038 B2 | 12/2015 | Cantone et al. |
| 9,666,451 B2 | 5/2017 | Wallace |
| 9,673,051 B1 | 6/2017 | Lee |
| 9,786,597 B2 | 10/2017 | Chang et al. |
| 9,991,156 B2 | 6/2018 | Burns |
| 2001/0021576 A1 | 9/2001 | Chi et al. |
| 2004/0007731 A1 | 1/2004 | Song |
| 2009/0206489 A1 | 8/2009 | Li |
| 2013/0048603 A1 | 2/2013 | Kim et al. |
| 2013/0277823 A1 | 10/2013 | Ogisu et al. |
| 2015/0243515 A1 | 8/2015 | Yuan |
| 2015/0339428 A1 | 11/2015 | Yuan |
| 2015/0380300 A1 | 12/2015 | Wu et al. |
| 2016/0111421 A1 | 4/2016 | Rodder et al. |
| 2017/0062327 A1 | 2/2017 | Kim |
| 2017/0090290 A1 | 3/2017 | Devilliers |
| 2017/0092506 A1 | 3/2017 | Devilliers |
| 2017/0125248 A1 | 5/2017 | Sew |
| 2017/0140986 A1 | 5/2017 | Machkaoutsan et al. |
| 2017/0148637 A1 | 5/2017 | Devilliers |
| 2017/0221704 A1 | 8/2017 | Mohanty et al. |
| 2017/0221902 A1 | 8/2017 | Kang |
| 2017/0229441 A1 | 8/2017 | Smayling |
| 2017/0271204 A1 | 9/2017 | Hwang |
| 2018/0233403 A1 | 8/2018 | Burns et al. |
| 2019/0013052 A1 | 1/2019 | Castro et al. |

SELF-ALIGNED QUADRUPLE PATTERNING (SAQP) FOR ROUTING LAYOUTS INCLUDING MULTI-TRACK JOGS

DOMESTIC PRIORITY

This application is a DIVISIONAL of U.S. patent application Ser. No. 15/949,325, filed Apr. 10, 2018, which is a DIVISIONAL of U.S. patent application Ser. No. 15/172,265, filed Jun. 3, 2016 (now U.S. Pat. No. 9,991,156 issued Jun. 5, 2018), the contents of which are incorporated by reference herein in their entireties.

BACKGROUND

The present invention generally relates to methods of forming a semiconductor device and methods of patterning a semiconductor device. More particularly, the present invention relates to a self-aligned quadruple patterning process for forming a semiconductor device that includes a multi-track jogged layout.

As the technology nodes scale down to 14 nm and beyond, self-aligned multiple patterning processes are being considered as practical solutions for the manufacturing process, wherein a conventional lithographic process is enhanced to produce multiple times the number of expected features. For example, the simplest case of multiple patterning is commonly referred to as Double Patterning Lithography (DPL), which produces double the expected number of features. Compared with Litho-Etch-Litho-Etch processes (LELE) used in prior technology nodes, multiple patterning processes provides better overlay tolerances. Self-Aligned Quadruple Patterning (SAQP) is considered an extension of DPL and is expected to be one of the major solutions for future process requirements after the 16 nm/14 nm technology node. SAQP is an advanced patterning approach that uses pitch splitting to further extend the capability of traditional lithography. It is targeted for implementation for both the front end of line (FEOL) fin patterning and back end of line (BEOL) Metal 1 layers.

Critical BEOL manufacturing patterning at 7 nm technology node requires sub-36 nanometer (nm) pitches necessitating the use of either extreme ultraviolet (EUV) lithography or 193 nm-immersion-lithography based SAQP processes. With enormous challenges being faced in getting EUV lithography ready for production, SAQP is being considered as an optional approach for manufacturing grid patterning for most of the industry. In contrast to the front end of line (FEOL) fin patterning, which has successfully deployed SAQP since 10 nm node technology, BEOL manufacturing SAQP is challenging owing to the required usage of significantly lower temperature budgets for film stack deposition.

SUMMARY

Disclosed herein are interconnect structures including multi-track jogs produced by a self-aligned quadruple patterning process having a pitch less than 40 nm and processes for forming the interconnect structures. In one or more embodiments, the self-aligned quadruple patterning process includes patterning a top mandrel layer disposed on a barrier layer to form a plurality of top mandrel line features and spaces therebetween; forming a top spacer structure with a top dielectric material adjacent to sidewalls of the top mandrel features; and backfilling the spaces with a top non-mandrel material, wherein the top non-mandrel material is selected to be etch selective relative to the top spacer structure and the top mandrel layer.

In one or more embodiments, the process includes providing a structure including an interlayer dielectric, top and bottom mandrel layers, and barrier layers therebetween; patterning a top mandrel layer to form a plurality of top mandrel line features and spaces therebetween; cutting at least one of the top mandrel line features to provide a gap corresponding to a $\gamma$ jog; forming a top spacer structure with a top dielectric material adjacent to sidewalls of the top mandrel features and in the gap; wherein the gap is smaller than two times a thickness of the top spacer structure; and filling the gap with the top dielectric material; and backfilling the spaces with a top non-mandrel material, wherein the top non-mandrel material is selected to be etch selective relative to the top spacer structure and the top mandrel layer.

The interconnect structures include three types of lines: a $\beta$ line defined by a patterned bottom mandrel formed in the self-aligned quadruple patterning process; a $\gamma$ line defined by location underneath a top mandrel formed in the self-aligned quadruple patterning process; and an $\alpha$ line defined by elimination located underneath neither the top mandrel or the bottom mandrel formed in the self-aligned quadruple patterning process.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present disclosure provides for methods for forming a semiconductor device that includes a multi-track jogged layout such as may be desired for BEOL manufacturing patterning at 7 nm technology node requiring sub-40 nm pitches. Increased alignment tolerances in patterning the jog is provided by the use of single cuts in a self-aligned quadruple patterning scheme to enable a multi-track jog. Additionally, the present disclosure provides a method for integrating all of the various options for jogs in the self-aligned quadruple pattering scheme, i.e., the different options for which specific lines are connected in the jog, thereby increasing intra-level density.

Although the following description and drawings of the present application disclose utilizing the methods of the present application for forming multi-track jogged layout for BEOL patterning, the present application is not limited to only the formation of BEOL patterns. Instead, the present application can be used in forming other types of structures such as FEOL fin patterning.

Figure 1:
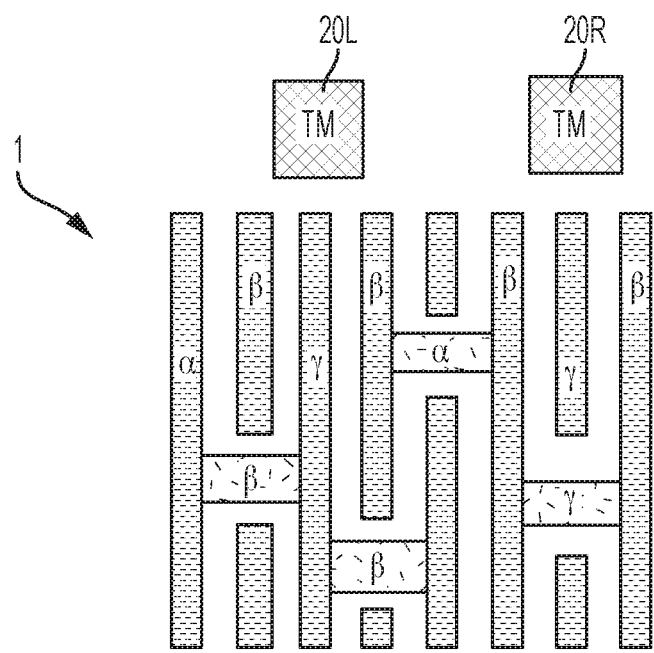
FIG. 1 schematically illustrates a top down structure of an exemplary interconnect routing layout including multiple jogged tracks produced by a self-aligned quadruple patterning process.

FIG. 1 depicts an illustrative designed layout pattern 1 for an exemplary interconnect structure including varying types of lines and spaces having a pitch less than 40 nm with jogged features therebetween, i.e., cross-connections between the different line features. The lines and jogged features will be defined by a self-aligned quadruple patterning process utilizing top and bottom mandrels to increase pattern density by repeating the spacer formation and pattern transfer steps, which advantageously can be utilized to provide pitches less than 40 nm. The various types of lines and jogs can be further characterized by location relative to the top mandrel features 20L and 20R utilized in the self aligned quadruple process to form the design layout pattern. The lines are designated $\alpha$, $\beta$, and $\gamma$ based on the location relative to the top mandrel and the corresponding cross track jogs between the different line features $\alpha$, $\beta$, and $\gamma$ can be classified as falling into one of three general types: $\beta\gamma\beta$, $\beta\alpha\beta$ and $\alpha\beta\gamma$ or $\gamma\beta\alpha$, wherein the first and third positions refer to the uncut line and the second position refers to the cut line. By way of example, the $\beta\gamma\beta$ cross track jog refers to adjacent uncut $\beta$ lines and a cut in the non-mandrel $\gamma$ line to form $\alpha$ jog extending between adjacent bottom mandrel $\beta$ lines.

As for the above nomenclature, the $\beta$ lines are defined by the patterned bottom mandrel; the $\gamma$ lines are defined by sidewall spacers of the patterned bottom mandrel located underneath the top mandrels 20L and 20R; and the $\alpha$ lines are those defined by elimination and are located underneath neither the top mandrel nor the bottom-mandrel.

As will be discussed in greater detail below, the $\beta\gamma\beta$ jog is formed subsequent to backfilling a top mandrel spacing with a top non-mandrel material by cutting the top mandrel (TM) with a gap smaller than 2 times the top spacer thickness. Because the cut defining the tips to tips of the top mandrel is smaller than twice the thickness of the top spacer, the spacer pinches and forms a bridge between portions of the bottom mandrels that underlie the same top mandrel. The top non-mandrel material is etch selective to both the top mandrel materials and the top spacer materials, wherein etching can be simultaneous done. The $\beta\alpha\beta$ jog is claimed by backfilling the top mandrel space after a spacer etch with a filler material (non-mandrel) that is resistant (along with top spacer material) to the pull chemistry of the top non-mandrel and top mandrel as well as the top spacer material but can also be used as a mask for etching the bottom mandrel. The $\alpha\beta\gamma$, $\gamma\beta\alpha$ jogs are claimed by cuts in the bottom mandrel with the tips to tips larger than twice the thickness of the bottom spacer causing pinch off, thereby creating the $\alpha\beta\gamma$, $\gamma\beta\alpha$ connections. In the embodiments that follow, FIGS. 2-10 depict methods to achieve these different connections.

Figure 2A:
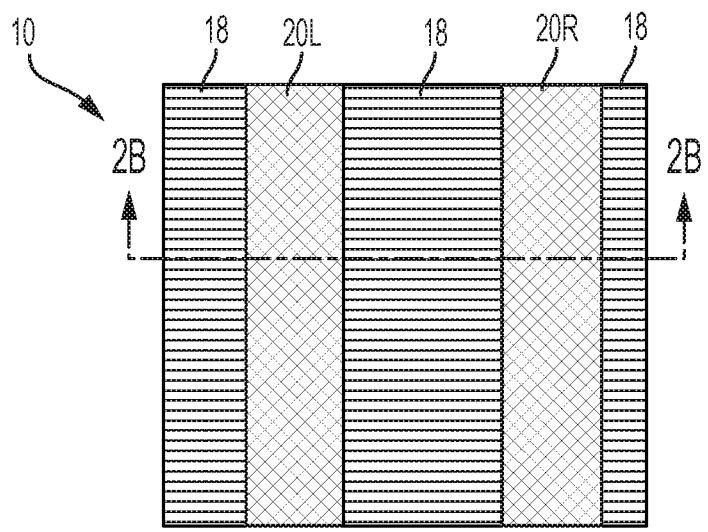
FIG. 2A is a top down view and FIG. 2B is a cross sectional view taken along lines 2B-2B after etching the top mandrel layer.
Figure 2B:
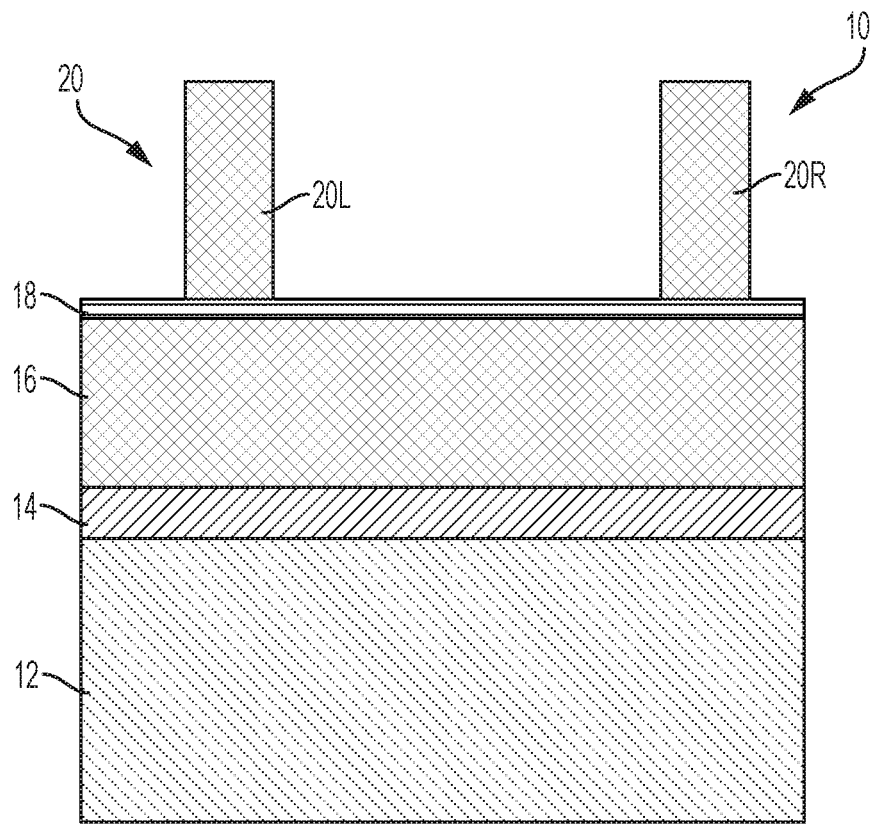

Referring now to FIGS. 2A and 2B, there is depicted an exemplary semiconductor structure 10 for forming the designed layout pattern of FIG. 1 comprising an interlayer dielectric layer (ILD) 12, a barrier layer 14, a bottom mandrel layer 16, an insulator layer 18 and patterned top mandrel structures 20L, 20R located on the insulator layer 18. The patterned top mandrel structures are lithographically patterned from a planar top mandrel layer generally designated by reference numeral 20.

The ILD 12 may comprise any dielectric material including inorganic dielectrics or organic dielectrics. The dielectric material may be porous or non-porous. Some examples of suitable dielectric materials include, but are not limited to: $SiO_2$, silsesquioxanes, carbon doped oxides (i.e., organo silicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD 12 may be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate (not shown). The thickness of the ILD generally ranges from 50 nm to 70 nm, although lesser and greater thicknesses can also be employed.

The barrier layer 14 may be formed of metals such as titanium (Ti), tantalum (Ta), tungsten (W), compounds such as titanium nitride and tantalum nitride, alloys such as TiW, doped metals such as titanium or tantalum doped with nitrogen (Ti(N) or Ta(N)) and bilayers such as Ti/W or Ta/TaN. In one or more embodiments, the barrier layer 14 is titanium nitride, which may be deposited through conventional deposition processes such as, for example, a plasma vapor deposition process such as R.F. sputtering. The thickness of the barrier layer 14 may vary depending on the exact means of the deposition process as well as the material employed. The titanium metal liner layer is used to provide adhesion between subsequent overlying structures, such as a tungsten plug structure, and ILD layer 12, as well as supplying the needed titanium, for subsequent formation of a titanium silicide layer, if desired. The thickness of the barrier layer 14 can be from 50 nm to 200 nm, although lesser and greater thicknesses can also be employed.

The bottom mandrel layer 16 may be formed of amorphous silicon. However, it should be noted that other materials (e.g., germanium, silicon germanium) may also be used for the mandrels so long as there is an etch selectivity with respect to subsequently formed sidewall spacers thereon, which will be discussed in greater detail below. The thickness of the bottom mandrel layer generally ranges from 40 nm to 100 nm, although lesser and greater thicknesses can also be employed.

The patterned mandrel structures 20L, 20R, like the bottom mandrel, may also be formed of amorphous silicon although, as noted above, other materials (e.g., germanium, silicon germanium) may also be used for the mandrels so long as there is sufficient etch selectivity with respect to subsequently formed sidewall spacers thereon. As shown, the top mandrel layer is first lithographically patterned to form the mandrel structures 20L and 20R.

The lithography process for forming the top mandrel pattern may comprise, for example, introducing electromagnetic radiation such as ultraviolet light through an overlay mask to cure a photoresist material (not shown). Depending upon whether the resist is positive or negative, uncured portions of the resist are removed to form a first resist pattern including openings to expose portions of the top mandrel layer.

The material defining photoresist layer may be any appropriate type of photo-resist materials, which may partly depend upon the device patterns to be formed and the exposure method used. For example, material of photo-resist layer may include a single exposure resist suitable for, for example, argon fluoride (ArF); a double exposure resist suitable for, for example, thermal cure system; and/or an extreme ultraviolet (EUV) resist suitable for, for example, an optical process. Photoresist layer may be formed to have a thickness ranging from about 30 nm to about 150 nm in various embodiments. The resist pattern may be formed by applying any appropriate photo-exposure method in consideration of the type of photo-resist material being used.

The photoresist pattern is then anisotropically etched such as by reactive ion etching (RIE) to define the first mandrel shapes 20L and 20R. The top mandrel shapes 20L and 20R have nearly vertical etch slopes or nearly vertical contact angles. By use of the terms "nearly vertical etch slope" or "nearly vertical contact angle" is meant an angle defined by the sidewall of the opening being formed of at least 80°, preferably about 90°, with the plane of the top mandrel layer being anisotropically etched.

The etching apparatus used in carrying out the anisotropic etch may comprise any commercially available reactive ion etching (RIE) apparatus, or magnetically enhanced reactive ion etching (MERIE) apparatus, capable of supporting a wafer of the size desired to be etched in which gases of the type used herein may be introduced at the flow rates to be discussed and a plasma maintained at the power levels required for the process. Such apparatus will be generally referred to herein as RIE apparatus, whether magnetically enhanced or not. Examples of such commercially available apparatus include the Precision 5000 magnetically enhanced reactive ion etcher available from Applied Materials, Inc.; the Rainbow reactive ion etcher by Lam; the reactive ion apparatus by Tegal Company; and the Quad reactive ion etcher by Drytek.

Figure 3A:
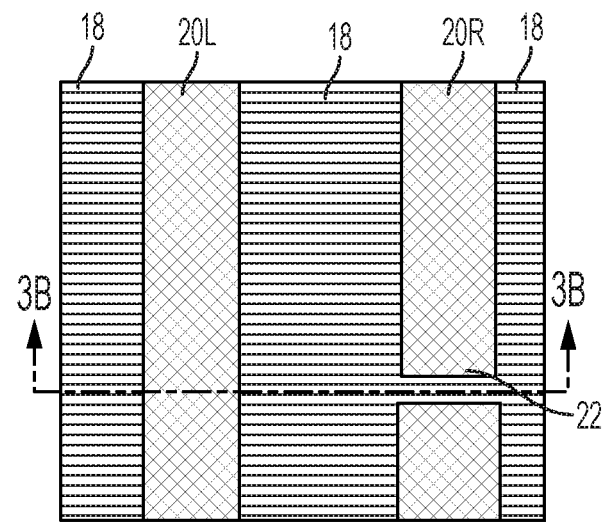
FIG. 3A is a top down view and FIG. 3B is a cross sectional view taken along lines 3B-3B after top mandrel tip definition.
Figure 3B:
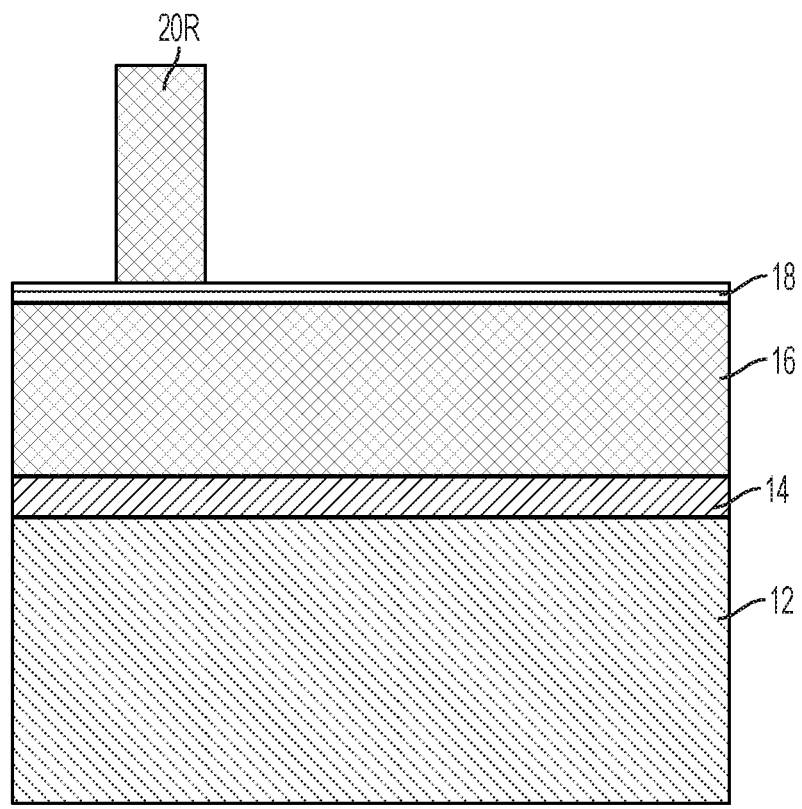

As shown in FIGS. 3A and 3B, a portion of the top mandrel structure 20R is then cut mask etched to form cut 22 (i.e., forms a gap within top mandrel line 20R), which generally defines the top mandrel tips in top mandrel structure 20R as shown more clearly in the top down schematic of FIG. 3A. The gap defined by tips to tips of top mandrel 20R (defined by the cut 22) is smaller than twice the thickness of top dielectric spacer 40 (shown and described with reference to FIGS. 4A and 4B, which will subsequently be used cause a pinch off bridge between the two bottom mandrels that underlie the same top mandrel for forming the $\beta\gamma\beta$ cross connections in the designed pattern of FIG. 1.

Figure 4A:
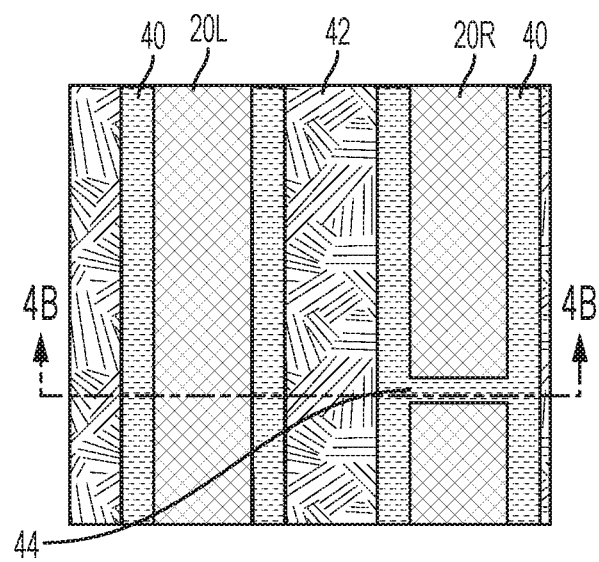
FIG. 4A is a top down view and FIG. 4B is a cross sectional view taken along lines 4B-4B after top spacer deposition, etching, and backfill of top non-mandrel space.
Figure 4B:
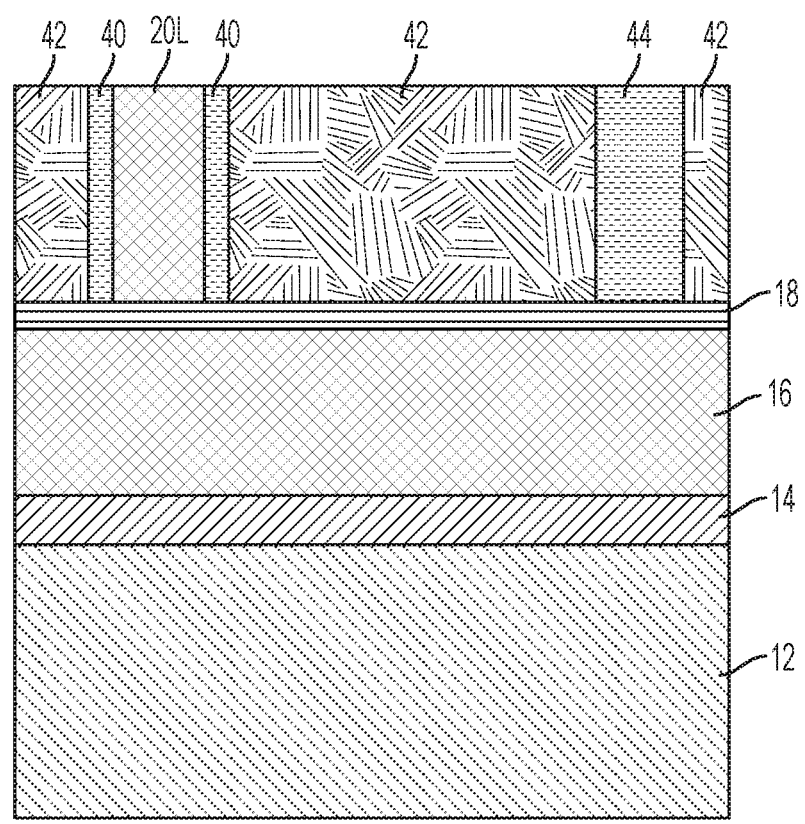

In FIGS. 4A and 4B, a top dielectric spacer 40 is formed on the sidewalls of the top mandrel features 20L and 20R and within the gap provided by cut 22 of top mandrel 20R so as to form the $\beta\gamma\beta$ connection generally designated by reference numeral 44. In addition, the spaces remaining after formation of the top dielectric spacer are backfilled with a top non-mandrel material 42.

An exemplary top spacer-forming layer 40 is conformally deposited such as by atomic layer deposition (ALD), plasma-enhanced chemical vapor deposition (PECVD), a low pressure chemical vapor deposition (LPCVD), or another chemical vapor deposition process. An exemplary spacer-forming layer contacts the upper surface of the upper hard mask layer 18, and the top surfaces and sidewalls of the top mandrels including the gap defined by cut 22. The dielectric spacer-forming layer may be formed of silicon nitride, silicon dioxide, or any type of organic or inorganic material having etch selectivity with respect to top mandrels 20L and 20R. The thickness of the top spacer layer is set by the target pitch line as this thickness generally determines the bottom mandrel, which in turn defines the space in which metallization is utilized to form the interconnect. The space is generally one half the pitch in most embodiments.

The top spacer layer 40 is then etched to barrier layer 18 to provide a metal spacer material on exposed sidewalls of the patterned top mandrel features 20L and 20R and between the tips defined by cut 22 in mandrel feature 20R as shown. The remaining space between the patterned top mandrel with the sidewall top metal spacers is then backfilled with a top non-mandrel filler material 42 that in turn can be cut selected to the top mandrel and top spacer so as to form a $\beta\alpha\beta$ jog upon subsequent patterning of the bottom mandrel. The non-mandrel filler material 42 is coplanar with the uppermost surfaces of the top mandrel features 20L and 20R.

Exemplary non-mandrel filler materials 42 include various spin on films including, but not limited to, silicon containing anti-reflective coatings (ARC) films, metallic spin on films, spin on films that contain rare earth elements, and the like.

Figure 5A:
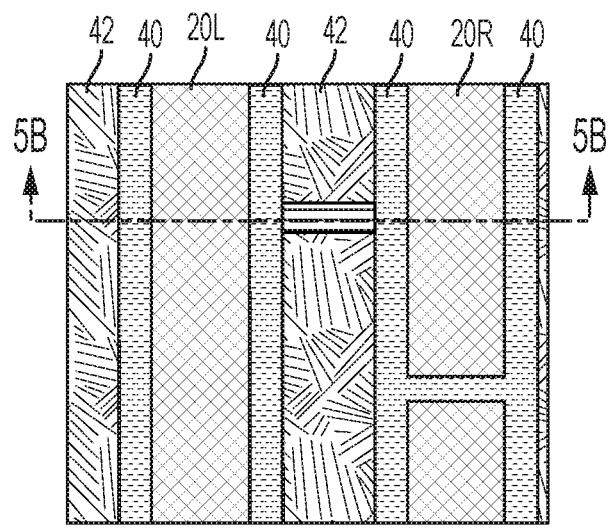
FIG. 5A is a top down view and FIG. 5B is a cross sectional view taken along lines 5B-5B after etching of top non-mandrel backfill to provide tip definition.
Figure 5B:
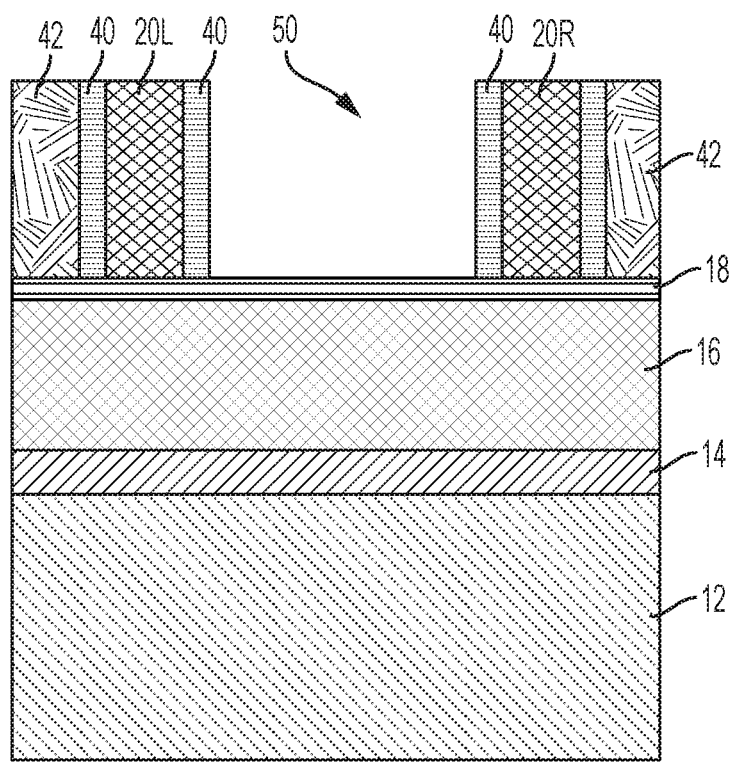

As shown in FIGS. 5A and 5B, the top non-mandrel backfill material 42 is then selectively etched to the barrier layer 18 to form cut 50. It should be apparent that there is a edge placement error (EPE) is minimized due to the 4× pitch and top non-mandrel to top mandrel etch selectivity. EPE is measured as the difference between the intended and printed features in a layout.

Figure 6A:
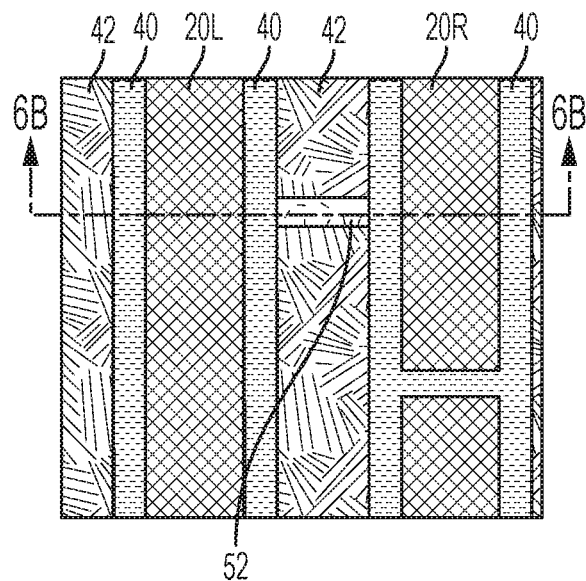
FIG. 6A is a top down view and FIG. 6B is a cross sectional view taken along lines 6B-6B after top non-mandrel space backfill cut and refill.
Figure 6B:
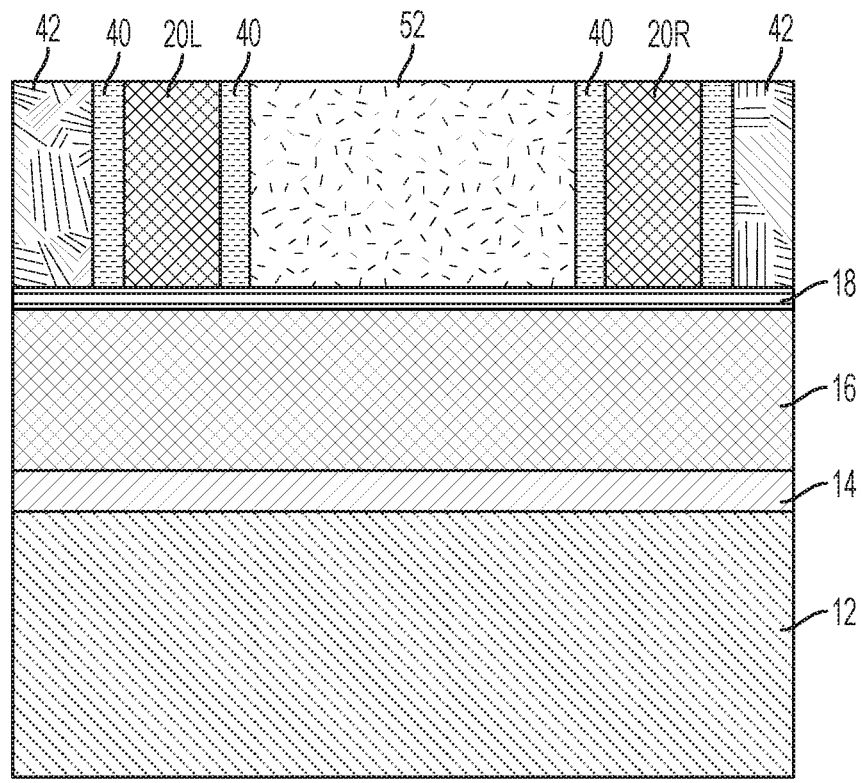

In FIGS. 6A and 6B, the top non-mandrel cut 50 is refilled with filler material 52 to form the $\beta\alpha\beta$ jog for the designed layout pattern 10. Filler material 52 is selected to have selectivity similar to that of the sidewall spacers 40. In some embodiments, filler material 52 is the same as the material used for forming top spacer layer 40. Filling cut 50 in the top non-mandrel 42 with another filler material allows the pull of the top mandrel and the top non-mandrel backfill material relative to the top spacer 40 and the top non-mandrel tip to tip fill 52 for forming the $\beta\alpha\beta$ connection.

Figure 7A:
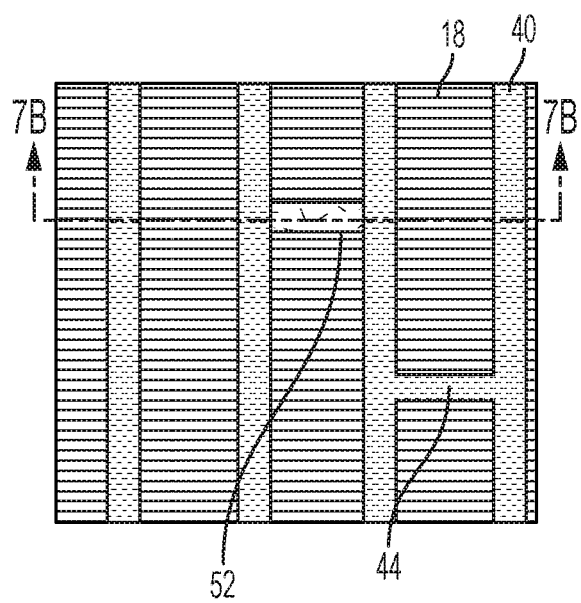
FIG. 7A is a top down view and 7B is a cross sectional view taken along lines 7B-7B after top non-mandrel and top mandrel pull(s)
Figure 7B:
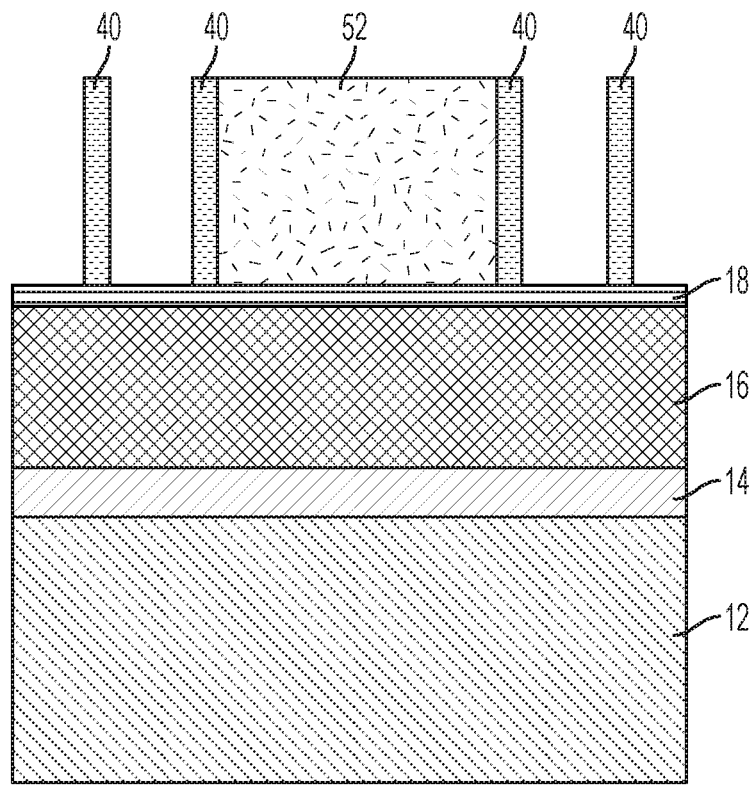

In FIGS. 7A and 7B, the top non-mandrel material 42 and top mandrels 20L, 20R are pulled leaving spacer features 40, the $\beta\alpha\beta$ connections 52, and the $\beta\gamma$ connections 44 in the top mandrel layer 20.

Figure 8A:
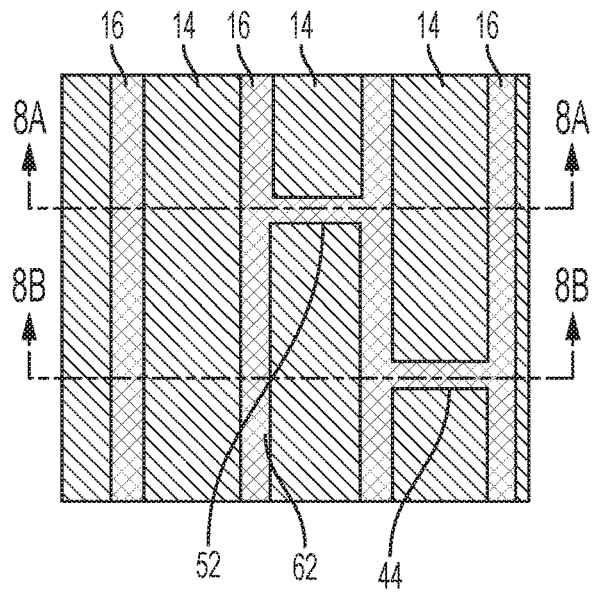
FIG. 8A is a top down view and FIGS. 8B, 8C are cross sectional views taken along lines 8B-8B and 8C-8C after bottom mandrel etch.
Figure 8B:
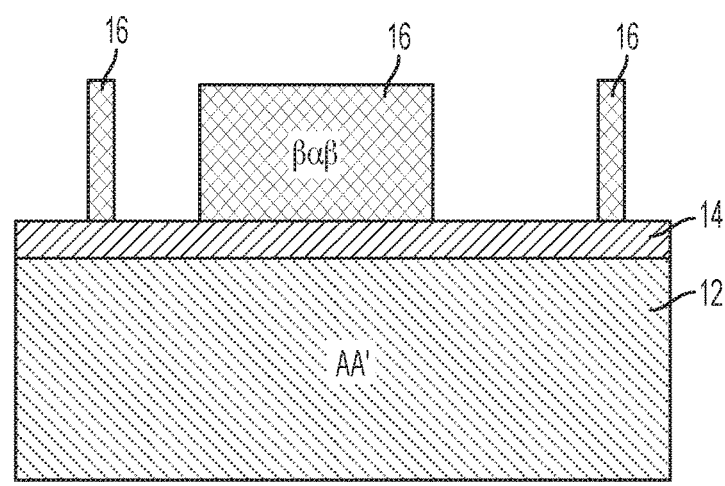
Figure 8C:
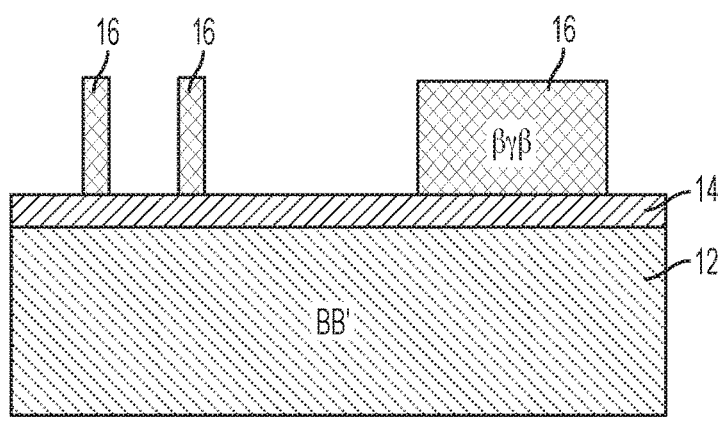

In FIGS. 8A, 8B, and 7c, an anisotropic transfer etch is made to transfer the patterned spacers 40, the $\beta\alpha\beta$ connections 52 and $\beta\gamma\beta$ connections 44 to the bottom mandrel layer 16 using layer 14 as an etch stop. As shown more clearly in FIG. 8B, the $\beta\alpha\beta$ connections are transferred to the bottom mandrel along with the corresponding spacer line segments 40. In FIG. 8C, it is the $\beta\gamma\beta$ connections that are transferred to the bottom mandrel 16 along with the corresponding spacer line segments.

Figure 9A:
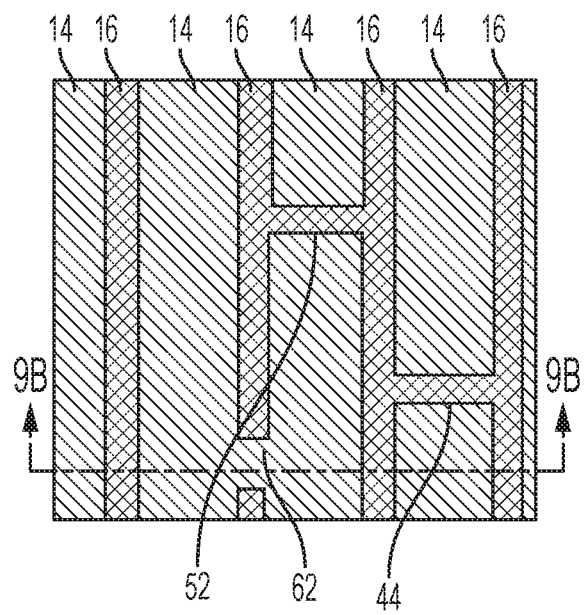
FIG. 9A is a top down view and FIG. 9B is a cross sectional view taken along lines 9B-9B after bottom mandrel tip definitions.
Figure 9B:
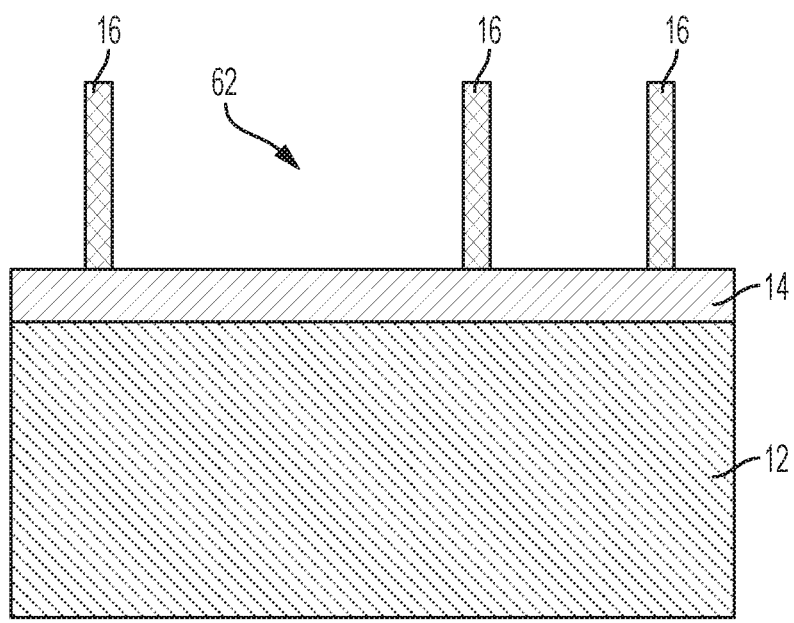
Figure 10A:
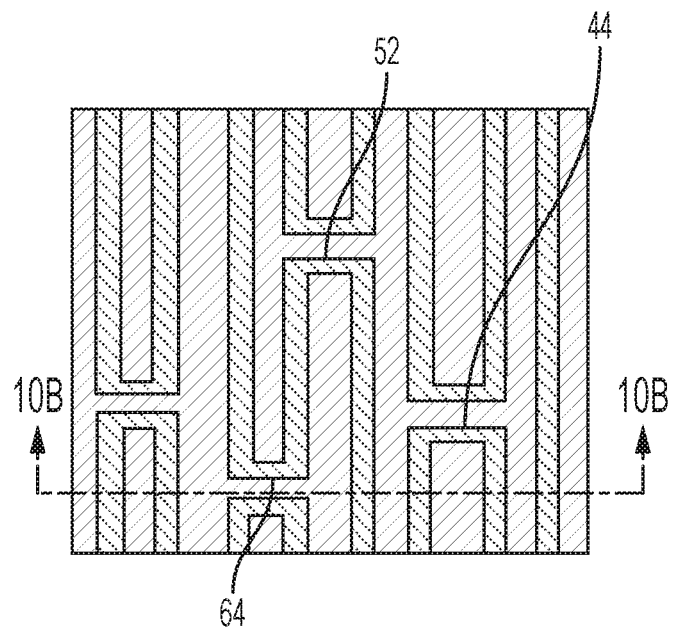
FIG. 10A is a top down view and FIG. 10B is a cross sectional view taken along lines 10B-10B after bottom spacer deposition, etch back and bottom mandrel pull.
Figure 10B:
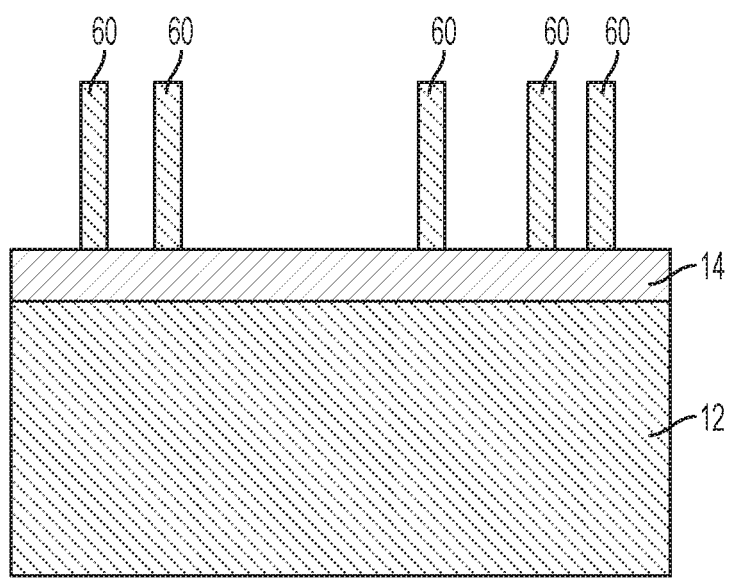

In FIGS. 9A and 9B, the bottom mandrel is selectively cut by cut 62, which can be used to form the $\alpha\beta\gamma$ and $\gamma\beta\alpha$ connections generally designated by reference numeral 64, shown in FIGS. 10a, 10B. In one or more embodiments, the tips to tips defined by cut 62 is larger than twice the thickness of a bottom spacer layer 60, which will subsequently cause a pinch off and hence the αβγ and γβα jog connections in the designed layout pattern of FIG. 1.

In FIGS. 10A and 10B, the bottom spacer layer 60 (such as silicon dioxide or silicon nitride, $Si_3N_4$, for example) is then deposited onto the patterned bottom mandrel layer 16. In accordance with one exemplary aspect, the bottom spacer 60 may deposited through a conformal film deposition process, such as, for example, atomic layer deposition (ALD), molecular layer deposition (MLD), or quasi-ALD or MLD processes. The bottom spacer layer 60 is then etched to the layer 14 to provide a spacer material abutting sidewalls of the patterned bottom mandrel features 16. The bottom mandrel 16 is then pulled to provide the patterned structure shown in FIG. 10A, which is then subjected to a metallization process to form the interconnect structure shown in the designed layout of FIG. 1.

Advantageously, the present invention provides for greater alignment tolerances in patterning the jogs by providing the cut in the first mandrel of a self-aligned quadruple patterning process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A self-aligned quadruple patterning process for forming an interconnect structure having a pitch of less than 40 nanometers, the process comprising:
    patterning a top mandrel layer disposed on a barrier layer to form a plurality of top mandrel line features and spaces therebetween;
    cutting at least one of the top mandrel line features to provide a gap corresponding to a γ jog, wherein the gap is smaller than two times a thickness of the top dielectric spacer;
    backfilling the spaces with a top non-mandrel material to form top non-mandrel backfilled spaces;
    cutting at least one of the top non-mandrel backfilled spaces to provide a gap corresponding to an α jog, wherein the gap is filled with a filler material etch selective to the top mandrel layer and the top non-mandrel material;
    forming a top dielectric spacer with a dielectric material adjacent to sidewalls of the top mandrel line features, wherein the dielectric material pinches within the gap so as to fill the gap; and
    completely backfilling the spaces with a top non-mandrel material, wherein the top non-mandrel material is selected to be etch selective relative to the dielectric material in the top dielectric spacer and the gap, and the top mandrel line features.

2. The process of claim 1, further comprising transferring structures of the top dielectric spacer into a bottom mandrel layer to form bottom mandrel features; cutting at least one of the bottom mandrel features to provide a gap corresponding to a β jog; forming a bottom spacer structure with a bottom dielectric material adjacent to sidewalls of the top mandrel line features, wherein the gap corresponding to the β jog is larger than two times a thickness of the bottom spacer structure.

3. The process of claim 1, further comprising pulling the top mandrel layer and the top non-mandrel material; and transferring structures of the top dielectric spacer into a bottom mandrel layer to form bottom mandrel features.

4. The process of claim 1, wherein the top non-mandrel material comprises silicon containing anti-reflective coatings (ARC) spin on films, metallic spin on films, or spin on films that contain rare earth elements.

5. The process of claim 1, wherein the top dielectric spacer comprises silicon nitride, or silicon dioxide.

6. The process of claim 1, wherein the bottom mandrel layer comprises amorphous silicon.

7. The process of claim 1, wherein the bottom mandrel layer is at a thickness within a range of 40 nanometers to 100 nanometers.

8. The process of claim 1, wherein the barrier layer comprises titanium, tantalum, tungsten, nitrides thereof, alloys thereof, or bilayers thereof.

9. The process of claim 1, wherein the barrier layer is at a thickness within a range of 50 nanometers to 200 nanometers.

10. A self-aligned quadruple patterning process for forming an interconnect structure having a pitch of less than 40 nanometers, the process comprising:
    providing a structure comprising an interlayer dielectric, top and bottom mandrel layers, and barrier layers therebetween;
    patterning a top mandrel layer to form a plurality of top mandrel line features and spaces therebetween;
    cutting at least one of the top mandrel line features to provide a gap corresponding to a γ jog;

forming a top spacer structure with a top dielectric material adjacent to sidewalls of the top mandrel line features and in the gap; wherein the gap is smaller than two times a thickness of the top spacer structure;

filling the gap with the top dielectric material; and backfilling the spaces with a top non-mandrel material to form top non-mandrel backfilled spaces, wherein the top non-mandrel material is selected to be etch selective relative to the top spacer structure and the top mandrel layer.

11. The process of claim 10, further comprising cutting at least one of the top non-mandrel backfilled spaces to provide a gap corresponding to an α jog; and filling the gap corresponding to the α jog with a filler material etch selective to the top mandrel layer and the top non-mandrel material.

12. The process of claim 11, further comprising pulling the top mandrel layer and the top non-mandrel material; transferring the top spacer structure including the filled gap corresponding to the α jog into the bottom mandrel layer to form bottom mandrel features; cutting at least one of the bottom mandrel features to provide a gap corresponding to a β jog; forming a bottom spacer structure with a bottom dielectric material adjacent to sidewalls of the top mandrel line features, wherein the gap corresponding to the β jog is larger than two times a thickness of the bottom spacer structure.

13. The process of claim 10, wherein the top non-mandrel material comprises silicon containing anti-reflective coatings (ARC) spin on films, metallic spin on films, or spin on films that contain rare earth elements.

14. The process of claim 10, wherein the top dielectric material comprises a dielectric material selected to be etch selective to the top mandrel layer and the top non-mandrel material.

15. The process of claim 10, wherein the top dielectric material comprises silicon nitride, or silicon dioxide.

16. The process of claim 10, wherein the barrier layer comprises titanium, tantalum, tungsten, nitrides thereof, alloys thereof, or bilayers thereof.

17. The process of claim 10, wherein the barrier layer is at a thickness within a range of 50 nanometers to 200 nanometers.

18. The process of claim 10, wherein the bottom mandrel layer is at a thickness within a range of 40 nanometers to 100 nanometers.

19. The process of claim 10, wherein the bottom mandrel layer comprises amorphous silicon.

* * * * *